(12) United States Patent
Brandt et al.

(10) Patent No.: US 11,094,779 B2
(45) Date of Patent: Aug. 17, 2021

(54) SEMICONDUCTOR DEVICE HAVING AN EDGE TERMINATION REGION COMPRISING A FIRST EDGE TERMINATION REGION OF A SECOND CONDUCTIVITY TYPE ADJACENT TO A SECOND EDGE TERMINATION REGION OF A FIRST CONDUCTIVITY TYPE

(71) Applicant: Infineon Technologies AG, Neubiberg (DE)

(72) Inventors: Philip Christoph Brandt, Oberhaching (DE); Andre Rainer Stegner, Munich (DE); Francisco Javier Santos Rodriguez, Villach (AT); Frank Dieter Pfirsch, Munich (DE); Hans-Joachim Schulze, Taufkirchen (DE); Manfred Pfaffenlehner, Munich (DE); Thomas Auer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 730 days.

(21) Appl. No.: 15/496,223

(22) Filed: Apr. 25, 2017

(65) Prior Publication Data
US 2017/0317165 A1 Nov. 2, 2017

(30) Foreign Application Priority Data
May 2, 2016 (DE) .................. 102016108125.6

(51) Int. Cl.
*H01L 29/78* (2006.01)
*H01L 29/06* (2006.01)
(Continued)

(52) U.S. Cl.
CPC ...... *H01L 29/0623* (2013.01); *H01L 21/2253* (2013.01); *H01L 21/266* (2013.01);
(Continued)

(58) Field of Classification Search
CPC ............ H01L 29/0615; H01L 29/0623; H01L 29/0638; H01L 29/7811
See application file for complete search history.

(56) References Cited

U.S. PATENT DOCUMENTS

| 2007/0007592 | A1* | 1/2007 | Barthelmess | ....... H01L 29/0638 257/341 |
| 2012/0126315 | A1* | 5/2012 | Onishi | ................ H01L 29/0634 257/329 |
| 2015/0340432 | A1 | 11/2015 | Siddiqui | |

FOREIGN PATENT DOCUMENTS

| CN | 102460652 A | 5/2012 |
| CN | 105051902 A | 11/2015 |

(Continued)

*Primary Examiner* — Anh D Mai
(74) *Attorney, Agent, or Firm* — Murphy, Bilak & Homiller, PLLC (57) ABSTRACT

An edge delimits a semiconductor body in a direction parallel to a first side of the semiconductor body. A peripheral area is arranged between the active area and edge. A first semiconductor region of a first conductivity type extends from the active area into the peripheral area. A second semiconductor region of a second conductivity type forms a pn-junction with the first semiconductor region. A first edge termination region of the second conductivity type arranged at the first side adjoins the first semiconductor region, between the second semiconductor region and edge. A second edge termination region of the first conductivity type arranged at the first side and between the first edge termination region and edge has a varying concentration of dopants of the first conductivity type which increases at least next to the first edge termination region substantially linearly with an increasing distance from the first edge termination region.

1 Claim, 7 Drawing Sheets

(51) Int. Cl.
    *H01L 29/66*     (2006.01)
    *H01L 29/861*     (2006.01)
    *H01L 21/225*     (2006.01)
    *H01L 21/266*     (2006.01)
    *H01L 21/324*     (2006.01)
    *H01L 21/761*     (2006.01)
    *H01L 29/739*     (2006.01)
    *H01L 29/74*     (2006.01)
    *H01L 21/265*     (2006.01)

(52) U.S. Cl.
    CPC .......... *H01L 21/324* (2013.01); *H01L 21/761* (2013.01); *H01L 29/0615* (2013.01); *H01L 29/0649* (2013.01); *H01L 29/0688* (2013.01); *H01L 29/66128* (2013.01); *H01L 29/7395* (2013.01); *H01L 29/7424* (2013.01); *H01L 29/7811* (2013.01); *H01L 29/8611* (2013.01); *H01L 21/2255* (2013.01); *H01L 21/26513* (2013.01); *H01L 21/26586* (2013.01)

(56) References Cited

FOREIGN PATENT DOCUMENTS

| | | |
|---|---|---|
| CN | 105321989 A | 2/2016 |
| DE | 102006023598 B3 | 11/2007 |
| DE | 102015105859 A1 | 11/2015 |
| JP | 2008227236 A | 3/2007 |
| JP | 2011238899 A | 11/2011 |

\* cited by examiner

SEMICONDUCTOR DEVICE HAVING AN EDGE TERMINATION REGION COMPRISING A FIRST EDGE TERMINATION REGION OF A SECOND CONDUCTIVITY TYPE ADJACENT TO A SECOND EDGE TERMINATION REGION OF A FIRST CONDUCTIVITY TYPE

TECHNICAL FIELD

Embodiments of the present invention relate to semiconductor devices, in particular to power semiconductor devices having in a peripheral area an edge termination region and to manufacturing methods therefor.

BACKGROUND

Semiconductor devices, e.g. MOSFETs or bipolar semiconductor devices such as a thyristor or an Insulated Gate Bipolar Transistor (IGBT) have been used for various applications including but not limited to use as switches in power supplies and power converters. Particularly with regard to power devices capable of switching large currents and/or operating at higher voltages, high breakdown voltages $U_{bd}$ and high robustness with respect to surface charges and/or cosmic radiation are often desired.

To achieve high breakdown voltages $U_{bd}$ of vertical semiconductor devices, an edge-termination structure for distributing the applied voltage over a wider region (widening of a space-charge region in a blocking mode) may be used in an edge region between active cells and a lateral edge of the semiconductor substrate of the respective semiconductor device. For example, field plates, field rings, and a partially or fully depletable semiconductor region may be used as edge-termination structure.

However, the edge region requires chip area and thus increases costs. In this regard, junction termination extension (JTE) regions with variable lateral doping concentration (VLD) have been found to be particularly interesting as they allow the desired widening of the space-charge region at the junction surface with comparatively low extra area and can be manufactured at comparatively low costs. However, the robustness of VLD-regions with respect to surface charges and/or cosmic radiation may be unsatisfactory.

Accordingly, there is a need to improve semiconductor devices with edge termination structures and manufacturing of those semiconductor devices.

SUMMARY

According to an embodiment of a semiconductor device, the semiconductor device includes a semiconductor body including a first side, an edge delimiting the semiconductor body in a direction parallel to the first side, an active area, a peripheral area arranged between the active area and the edge, a first semiconductor region of a first conductivity type extending from the active area into the peripheral area, a second semiconductor region of a second conductivity type forming a pn-junction with the first semiconductor region, a first edge termination region of the second conductivity type adjoining the first semiconductor region, and arranged at the first side and between the second semiconductor region and the edge, and a second edge termination region of the first conductivity type arranged at the first side and between the first edge termination region and the edge. The second edge termination region has a varying concentration of dopants of the first conductivity type which increases at least next to the first edge termination region substantially linearly with an increasing distance from the first edge termination region and/or with an increasing distance from the active area.

According to an embodiment of a semiconductor device, the semiconductor device includes a semiconductor body including a first side, an edge delimiting the semiconductor body in a direction parallel to the first side, a first semiconductor region of a first conductivity type, a second semiconductor region of a second conductivity type forming a pn-junction with the first semiconductor region, a first edge termination region of the second conductivity type which adjoins the first semiconductor region, and is arranged between the second semiconductor region and the edge, and a second edge termination region of the first conductivity type forming a further pn-junction with the first edge termination region. The second edge termination region is arranged between the first edge termination region and the edge but not between the first edge termination region and the first side, and has a varying concentration of dopants of the first conductivity type which increases with increasing distance from the further pn-junction. The second edge termination region has, in a vertical direction perpendicular to the first side, a first extension and, in a horizontal direction parallel to the first side, a second extension which is at least two times larger than the first extension.

According to an embodiment of a method for manufacturing a semiconductor device, the method includes providing a wafer having an upper side and including a semiconductor layer extending to the upper side. An active area and a peripheral area surrounding the active area when seen from above are defined. From the upper side donors and acceptors are introduced into the semiconductor layer so that a first edge termination region and a second edge termination region of opposite conductivity type are formed at the upper side in respective portions of the semiconductor layer which are arranged in the peripheral area. The method is performed so that the first edge termination region is arranged between the second edge termination region and the active area, and has in a vertical direction perpendicular to the upper side a first extension, and in a horizontal direction parallel to the upper side a second extension which is at least two times larger than the first extension. The method is performed so that the second edge termination region has in the vertical direction a third extension, and in the horizontal direction a fourth extension which is at least two times larger than the third extension, and that the second edge termination region includes a varying concentration of dopants which decreases, at least next to the first edge termination region, with a decreasing distance from the first edge termination region and/or with a decreasing distance from the active area.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 5B to 6B illustrate method steps of a method according to embodiments.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side or surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface or side while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to power semiconductor devices and manufacturing methods therefor. Within this specification the terms "semiconductor device" and "semiconductor component" are used synonymously. The semiconductor device is typically a vertical semiconductor device such as a vertical IGBT with an emitter metallization and a gate electrode arranged next the first surface (insulated from the semiconductor body by a gate dielectric and in ohmic contact with a gate metallization arranged on the first surface) and a collector metallization arranged on a second surface arranged opposite to the first surface. Typically, the IGBT is a power semiconductor device having an active area with a plurality of IGBT-cells (and/or reverse conducting IGBT-cells) for carrying and/or controlling a bipolar load current between the emitter metallization and the collector metallization. The semiconductor device may also be a three-terminal vertical thyristor with a collector metallization and a gate metallization arranged on the first surface and an anode metallization arranged on the second surface. The semiconductor device may also be a three-terminal vertical bipolar transistor or a vertical bipolar diode with only two terminals, e.g. an anode metallization arranged on the first side and a cathode metallization arranged opposite. The semiconductor device may also be a MOSFET, in particular a power MOSFET.

In the context of the present specification, the term "metallization" intends to describe a region or a layer with metallic or near metallic properties with respect to electric conductivity. Accordingly, a metallization may form an equipotential region during device operation. A metallization may be in contact with a semiconductor region to form an electrode, a lead, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, PtSi, $WSi_2$, MoSi, or an electrically conductive carbide such as AlC, NiC, MoC, TiC, PtC, WC or the like. The metallization may also include different electrically conductive materials, for example a stack of those materials.

Furthermore, the semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range (depending on the size of the device e.g. 100 A, 200 A or even a few kA) and/or voltages of more than about 10 V or even more than about 100 V or about 500 V or about 1000 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the maximum electrical field strength around a termination region of a rectifying junction by spreading the electric field lines across the termination region.

In the context of the present specification, the terms "in ohmic contact", "in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material, i.e. a semiconductor material with a band-gap above 1 eV such as SiC or GaN which has a high breakdown field strength and high critical avalanche field strength, respectively, the doping of the respective semiconductor regions can be chosen higher which reduces the on-state resistance Ron in the following also referred to as on-resistance Ron.

Figure 1A:
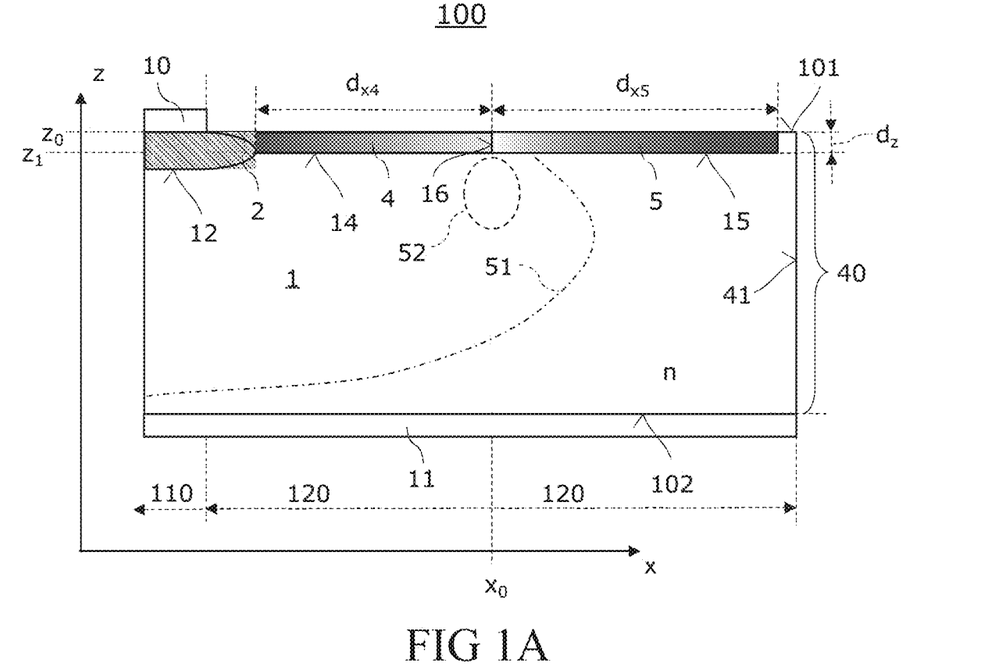
FIG. 1A illustrates a vertical cross-section through a semiconductor body of a semiconductor device according to an embodiment.

With reference to FIG. 1A, a first embodiment of a semiconductor device 100 is explained. FIG. 1A illustrates a right section of a vertical cross-section through a semiconductor body 40 of the semiconductor device 100. The semiconductor body 40 extends between a first surface 101, facing a vertical direction z, and a second surface 102 arranged opposite to the first surface 101. As illustrated in FIG. 1A, the first surface 101 and the second surface 102 may be substantially flat (planes). In the following, the first surface 101 and the second surface 102 are also referred to as upper side and lower side, respectively.

In a horizontal direction x that is substantially parallel to the first surface 101, the semiconductor body 40 is delimited by an edge 41, for example a sawing edge, which is substantially orthogonal to the first surface 101. Typically, the edge 41 surrounds the semiconductor body 40 when seen from above. In the following the edge 41 is also referred to as lateral edge. When seen from above, the semiconductor body 40 may have a polygonal shape, e.g. a rectangular shape.

The semiconductor body 40 has an active area 110 and a peripheral area 120 arranged between the active area 110 and the edge 41. Typically, the peripheral area 120 surrounds the active area 110 when seen from above.

For sake of clarity, only a typically small fraction of the active area 110 is illustrated in FIG. 1A.

An n-type first semiconductor region 1 extends from the active area 110 into the peripheral area 120. The first semiconductor region 1 may extend to the edge 41.

In the exemplary embodiment, the first semiconductor region 1 extends between the second and first surfaces 101, 102. The first semiconductor region 1 may even form the second surface 102 but typically emitter or drain regions are formed in the area adjoining the wafer backside.

In the active area 110, a p-type second semiconductor region 2 forms next to the first surface 101 a pn-junction 12 with the first semiconductor region 1. The second semiconductor region 2 may extend into the peripheral area 120.

A first metallization 10 arranged on the first surface 101 in the active area 110 is in Ohmic contact with the second semiconductor region 2.

A second metallization 11 is arranged on the second surface 102. The second metallization 11 may substantially cover the second surface 102.

In the exemplary embodiment, the second metallization 11 is in Ohmic contact with the first semiconductor region 1. Accordingly, semiconductor device 100 may be implemented as a bipolar diode or a power MOSFET with the first metallization 10 and the second metallization 11 forming an anode/source metallization 10 and a cathode/drain metallization 11, respectively. Note that the doping relations may also be reversed. This applies also to the following figures.

In the peripheral area 120, a p-type first edge termination region 4 and an n-type second edge termination region 5 are arranged at the first surface 101 and between the first semiconductor region 1 and the first surface 101.

The first edge termination region 4 is arranged between the second semiconductor region 2 and the edge 41, forms a further pn-junction 14 with the first semiconductor region 1 and a part of this edge termination 4 may optionally be in Ohmic contact with the first metallization 10. A maximum doping concentration of the first edge termination region 4 is typically lower than a maximum doping concentration of the typically adjoining second semiconductor region 2.

The second edge termination region 5 is arranged between the first edge termination region 4 and the edge 41.

Next to an interface 15 formed between the second edge termination region 5 and the first semiconductor region 1, an n-type doping concentration of the second edge termination region 5 is higher than an n-type doping concentration of the first semiconductor region 1 next to the interface 15. A possible exception is a boundary region where the first semiconductor region 1, the first edge termination region 4, and the second edge termination region 5 converge.

As illustrated in FIG. 1A, a pn-junction 16 is typically formed between the first edge termination region 4 and the second edge termination region 5.

Figure 7A:
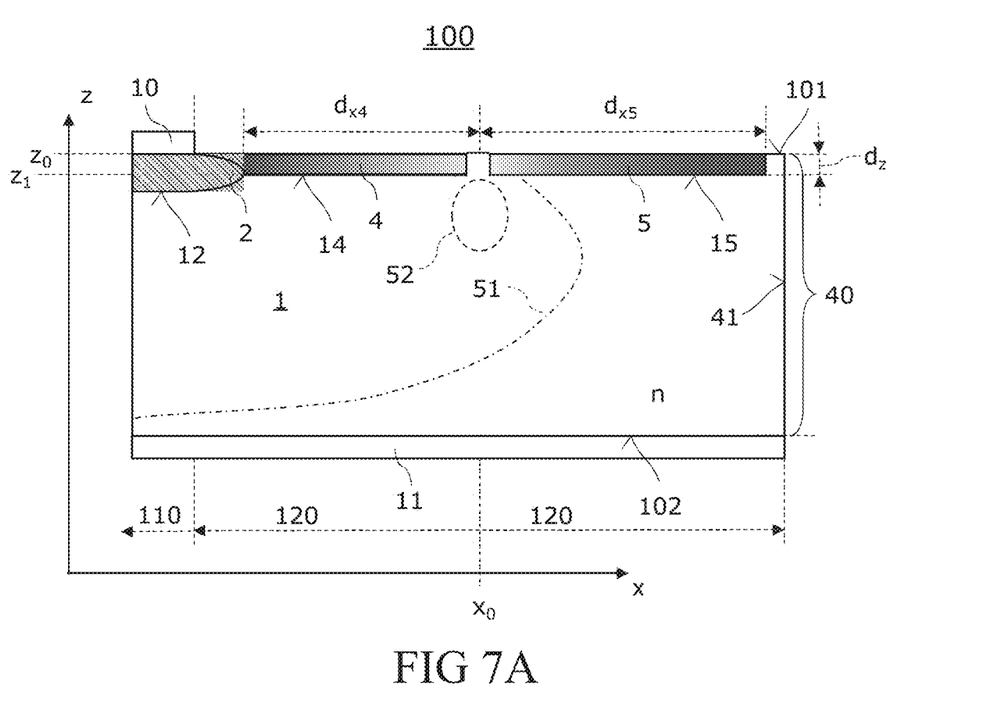
FIG. 7A illustrates a vertical cross-section through a semiconductor body of a semiconductor device according to an embodiment.

However, the first edge termination region 4 and the second edge termination region 5 may also be separated from each other by a portion of the first semiconductor region 1 as shown in FIG. 7A.

According to an embodiment, the second edge termination region 5 has a varying concentration of n-dopants, which increases at least next to the first edge termination region 4 substantially linearly with an increasing distance from the first edge termination region 4 and the pn-junction 16, respectively, as well as with an increasing distance from the active area 110 and a decreasing distance from the edge 41, respectively.

For example, the concentration of n-dopants in the second edge termination region 5 may increase substantially linearly with an increasing horizontal distance $x-x_0$ from the first edge termination region 4 and the pn-junction 16, respectively, up to a horizontal distance $x-x_0$ of at least about two times, more typically of at least about five times a vertical extension $d_z$ of the second edge termination region 5.

In the context of the present specification, the term of a substantially linearly increasing (or decreasing) concentration (of dopants) intends to describe a concentration that increases (or decreases) as function of a co-ordinate in such a way that a maximum deviation and/or a root mean square deviation from a linear relationship between the concentration and the co-ordinate is less than 50%, more typically less than about 15% or even 5%.

Due to the (substantially) linearly increasing concentration of n-dopants in the second edge termination region 5, a better robustness with regard to surface charges and/or cosmic radiation may be achieved compared to other JTE-regions.

The robustness can be further improved if the first edge termination region 4 has at least next to the second edge termination region 5 a varying concentration of p-dopants which decreases with a decreasing distance from the second edge termination region 5 and the pn-junction 16, respectively.

The robustness can be even further improved if the negative slope of the varying concentration of p-dopants in the first edge termination region 4 substantially matches the slope of the varying concentration of n-dopants in the second edge termination region 5.

In one embodiment, the difference between the concentration of p-dopants and the concentration of n-dopants varies, at least next to the pn-junction 16, substantially linearly in a horizontal direction (x) parallel to the first surface 101 (perpendicular to the pn-junction 16 in the exemplary embodiment illustrated in FIG. 1A).

The concentration of n-dopants, p-dopants as well as difference between the concentrations of n-dopants and p-dopants may vary substantially linearly as function of the horizontal co-ordinate x if the concentration of n-dopants and p-dopants are determined as area specific values at the horizontal co-ordinate x, in particular obtained by mathematically integrating respective volume specific concentrations at the horizontal co-ordinate x, or if the concentration of n-dopants and p-dopants are determined as vertically averaged volume specific concentrations.

For example, an integral, that can be obtained by integrating a difference between the concentration of n-dopants per unit volume and the concentration of p-dopants per unit volume along an integration path, which is perpendicular to a horizontal line at $z=z_1$ in FIG. 1A defined by the distance $d_z$ of the pn-junction 14 and the junction 15, respectively, from the first surface (penetration depths of the first and second edge termination regions 4, 5) and extends from the horizontal line to the first surface, may vary at least next to a pn-junction 16 (next to $x_0$, e.g. at least if $|x-x_0|<=2*d_z$) substantially linearly with x.

Alternatively or in addition, the concentration of n-dopants, p-dopants as well as difference between the concentrations of n-dopants and p-dopants may vary substantially linearly as function of the horizontal co-ordinate x in one or more horizontal planes of the semiconductor body 40 parallel to the first surface 101.

In a blocking mode of the bipolar semiconductor device 100, in which the pn-junction 12 is reversely biased, a space charge region is, depending on the voltage difference between the second metallization 11 and the first metallization 10, formed in the first semiconductor region 1 as indicated by the dashed-dotted line 51.

During the blocking mode, the most critical region 52 for /avalanche) breakdown limiting the breakdown voltage $V_{BR}$ of the device 100 is close to the outer edge of the first edge termination region 4.

To ensure a breakdown voltage $V_{BR}$, the concentration of p-dopants should be low in the first edge termination region 4 next to the pn-junction 16. Due to an increasing concentration of p-dopants and n-dopants with increasing respective distance from the pn-junction 16, electrons and holes that may be generated in the region 52. e.g. due to cosmic radiation and avalanche amplification may be safely guided (away from the first surface 101) and finally discharged through current paths in the first edge termination region 4 (holes) and the second semiconductor region 2 (electrons).

This is of particular importance for generated hot electrons. Accordingly, the concentration of n-type dopants may increase to comparatively high values of up to about $5*10^{14}/cm^2$, about $5*10^{15}/cm^2$ or even about $1*10^{17}/cm^2$ next to the edge 41.

Due to the (substantially) linear concentration profile(s), a sufficiently low horizontal component of the electric field during the blocking mode ensures save guiding of generated charges out of and outside the space charge region 51.

Further, the authors have found out that any charges trapped at or above the first surface 101 in the peripheral area 120 have at most only a minor impact on the breakdown voltage $V_{BR}$ if the concentration n-dopants and of p-dopants vary linearly or at least substantially linearly in horizontal direction(s) next to the pn-junction 16.

Furthermore, the authors have found out that a particularly high robustness can be achieved when comparatively thin edge termination regions 4, 5 are used.

Typically, a horizontal extension $dx_5$ of the second edge termination region 5 is at least two times or even 5 times larger than the vertical extension $d_z$ of the second edge termination region 5.

Likewise, a horizontal extension $dx_4$ of the first edge termination region 4 is typically at least two times larger or even 5 times larger than the extension $d_z$ of the first edge termination region 4.

Figure 1B:
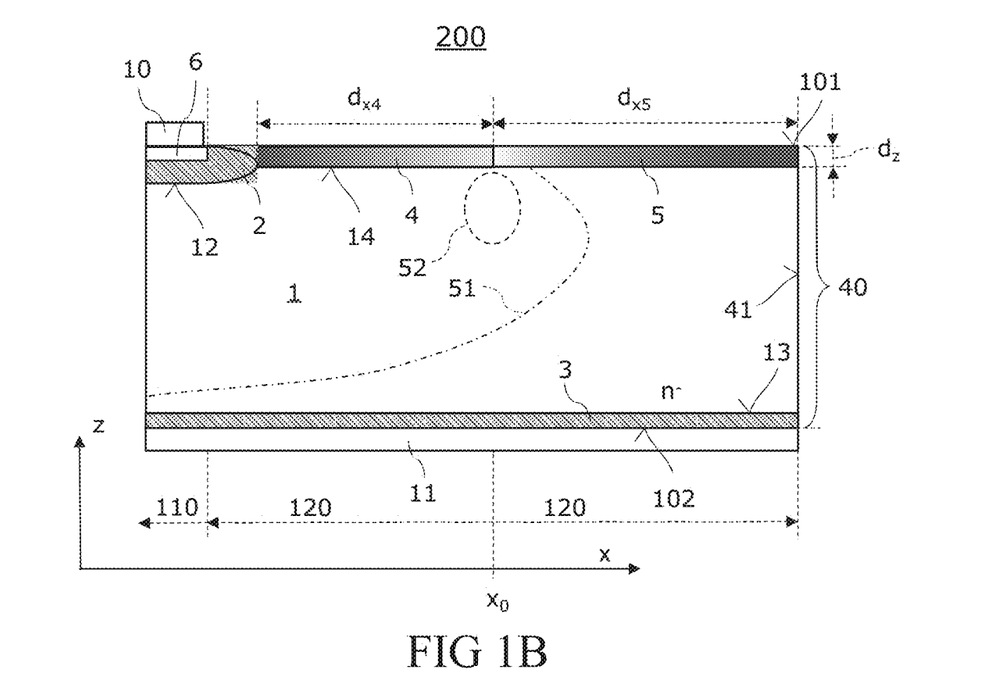
FIG. 1B illustrates a vertical cross-section through a semiconductor body of a bipolar semiconductor device according to an embodiment.

FIG. 1B illustrates a right section of a vertical cross-section through a bipolar semiconductor device 200. The semiconductor device 200 is similar to the bipolar semiconductor device 100 explained above with regard to FIG. 1A. However, semiconductor device 200 is implemented as a thyristor.

Accordingly, a p-type third semiconductor region 3 is arranged between the first semiconductor region 1 and the second metallization 11 typically forming an anode metallization, is in ohmic contact with the second metallization 11 and forms a pn-junction 13 with the first semiconductor region 1.

Further, an n-type fourth semiconductor region 6 forming a further pn-junction with the second semiconductor region 2 is arranged between the second semiconductor region 2 and the first metallization 10, and in Ohmic contact with the first metallization 10 typically forming an anode metallization.

In the exemplary embodiment, the second semiconductor region 2 forms a base region of the thyristor 200 in ohmic contact with a gate metallization (not shown in FIG. 1B) that may also be arranged on the first surface 101 in the active area 120.

Accordingly, the semiconductor device 200 may be operated as a three-terminal device.

The maximum doping concentration (of acceptors) of the second semiconductor region 2 may be typically lower than about $10^{18}$ cm$^{-3}$, more typically lower than about $5*10^{17}$ cm$^{-3}$ or even lower than about $10^{17}$ cm$^{-3}$.

The second edge termination region 5 may extend to the edge 41 and may have close to the edge dopant concentrations higher than about $10^{17}$ cm$^{-3}$, higher than about $5*10^{17}$ cm$^{-3}$ or even higher than about $10^{18}$ cm$^{-3}$.

Accordingly, the second edge termination region 5 may form a channel stopper region.

In particular next to the edge 41, the concentration of n-dopants may, at least in a section, also increase steeper than linearly. Further, the lateral increase of the doping concentration can be increased step-wise next to the edge 41 instead of a gradual increase.

However, the second edge termination region 5 may also extend to the first surface 101 in the peripheral area 120 similar as shown in FIG. 1A.

In another embodiment, a bipolar semiconductor device is implemented as a bipolar transistor. For example, the bipolar transistor may be similar as the thyristor 200, however without the fourth semiconductor region 6. In this embodiment, the first metallization may be in ohmic contact with the second semiconductor region and a control metallization may be in ohmic contact with the first semiconductor region forming a base region.

Figure 2A:
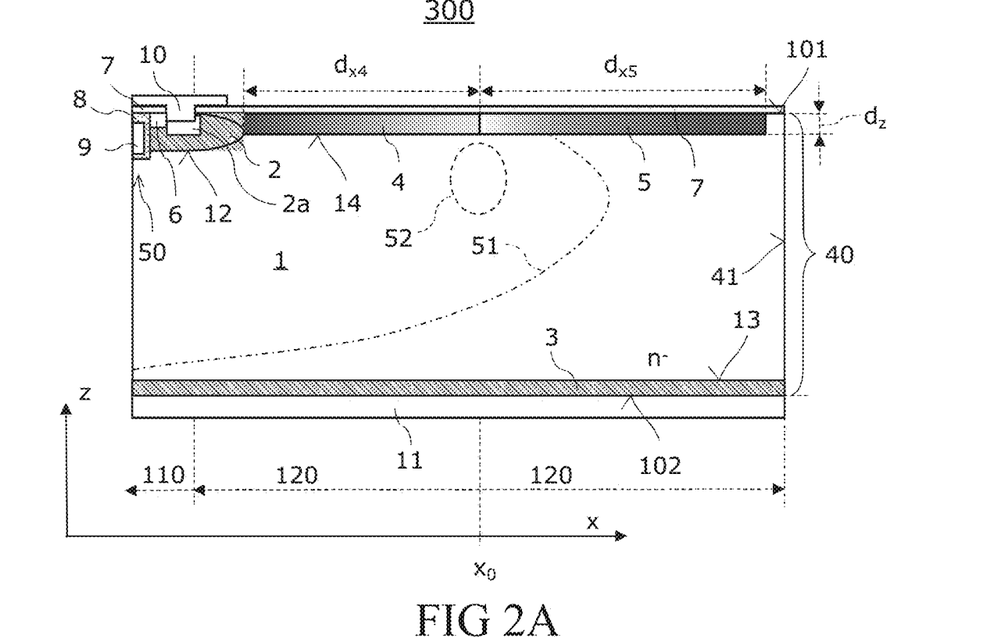
FIG. 2A illustrates a vertical cross-section through a semiconductor body of a bipolar semiconductor device according to an embodiment.

FIG. 2A illustrates a right section of a vertical cross-section through a bipolar semiconductor device 300. The semiconductor device 300 is similar to the bipolar semiconductor device 100, 200 explained above with regard to FIG. 1A, 1B. However, semiconductor device 300 is implemented as an IGBT.

In the exemplary embodiment, the second semiconductor region 2, the first metallization 10 and the second metallization 11 form a body region, an emitter metallization and a collector metallization, respectively, of the IGBT.

An ohmic contact between the body region 2 and the emitter metallization 10 may be provided by a p-type contact region 2a having a higher doping concentration than the body region 2.

Further, a p-type third semiconductor region 3 forming a collector region is arranged between the first semiconductor region 1 forming a drift region and the second metallization 11, is in ohmic contact with the second metallization 11 and forms a pn-junction 13 with the first semiconductor region 1.

Further, an n-type fourth semiconductor region 6 forming a further pn-junction with the second semiconductor region 2 is arranged between the second semiconductor region 2 and the first metallization 10, and in Ohmic contact with the first metallization 10. In the exemplary embodiment, the fourth semiconductor region 6 forms an emitter or source region of the IGBT 300.

In the exemplary embodiment, a gate electrode 9 separated from the semiconductor body 40 by a gate dielectric region 8 is implemented as a trench gate electrode, i.e. arranged in a trench 50 extending from the first surface 101, through the emitter region 6 and the body region 2 and partly into the drift region 1.

The gate electrode 9 is typically in ohmic contact with a control metallization (not shown in FIG. 2A) arranged on the first surface 101 and separated from the emitter metallization 10.

Typically, a plurality of gate electrodes 9 are arranged in the active area 120 of the IGBT 300.

As illustrated in FIG. 2A, a dielectric layer 7 may cover the first side 101 in the peripheral area 120 and the active area 110. In the active area 110, suitable trough-contacts may be formed through the dielectric layer 7 to connect the gate electrode(s) 9, the emitter/source region(s) 6 and the body region(s) 2 with the respective metallization.

Figure 2B:
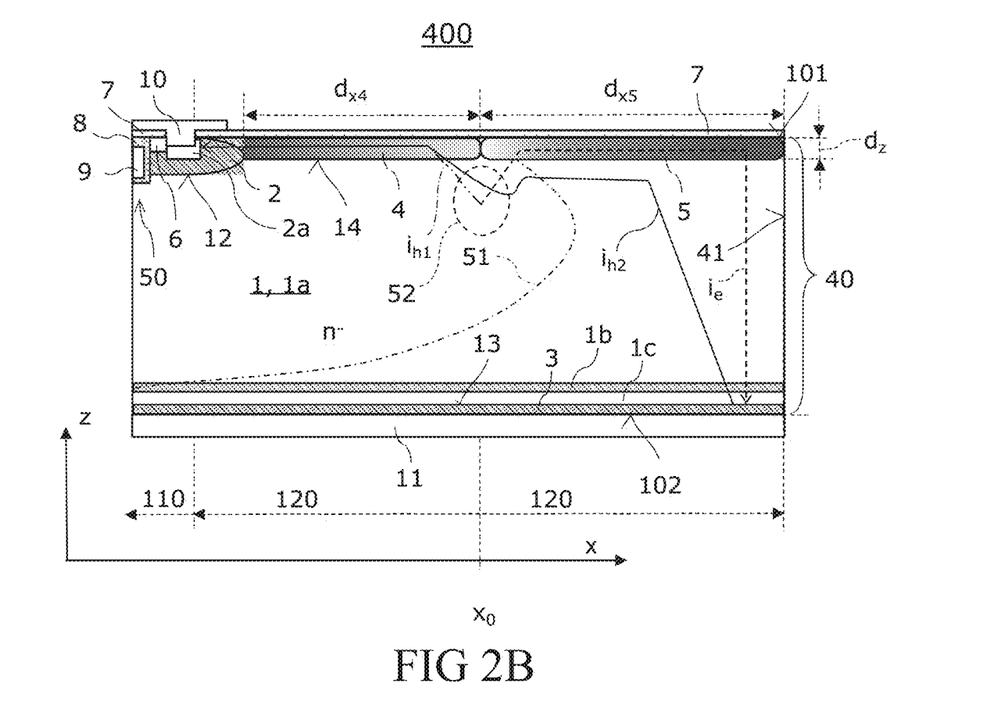
FIG. 2B illustrates a vertical cross-section through a semiconductor body of a bipolar semiconductor device according to an embodiment.

FIG. 2B illustrates a right section of a vertical cross-section through a bipolar semiconductor device 400. The semiconductor device 400 is similar to the bipolar semiconductor device 300 explained above with regard to FIG. 2A and is also implemented as an IGBT.

However, the semiconductor device 400 further includes between an upper portion 1a of the drift region 1 and a lowermost portion 1c of the drift region 1 a field-stop layer 1b having a higher doping concentration than the portions 1a and 1c.

Furthermore, typical current paths during blocking mode after a charge generating event, for example a streamer that may be induced by cosmic radiation at high blocking voltage, in region 52 of the space charge region 51 are schematically shown in FIG. 2B: a primary hole current $i_{h1}$ and an electron current $i_e$ resulting from the charge generating event and a secondary hole current $i_{h2}$ which is due to the electron current $i_e$.

Due to the first edge termination region 4 and the second edge termination region 5 as described above, the currents can be guided out of the space charge region, which limits avalanche processes, and safely be discharged to the respective metallizations 10, 11. This reduces the risk of entrapping hot charge carriers in the dielectric layer 7.

Figure 3A:
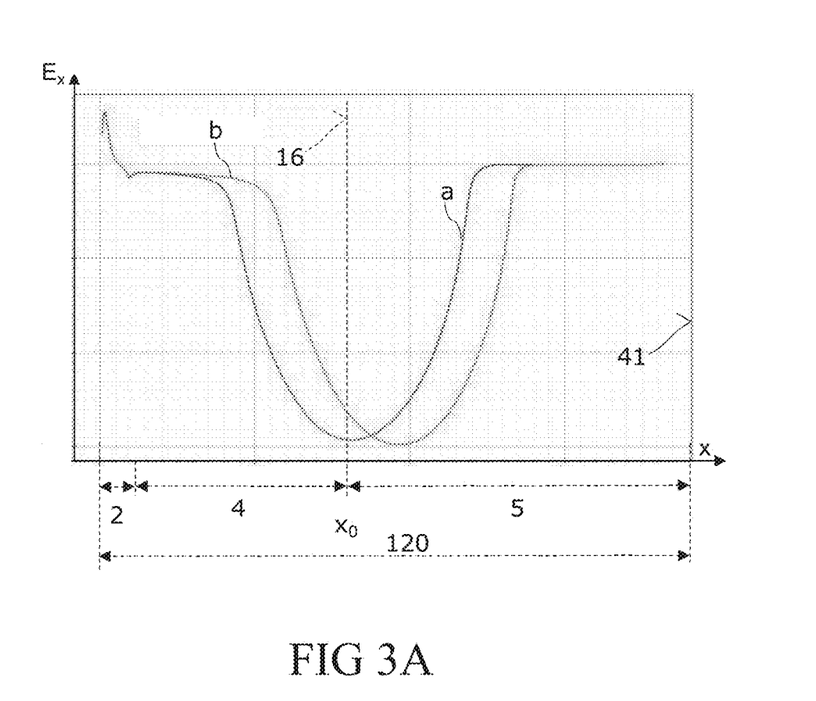
FIG. 3A illustrates electric field distributions in the semiconductor device as illustrated in FIGS. 1A to 2B according to an embodiment.

FIG. 3A illustrates horizontal electric fields Ex (in a.u.) in the peripheral area 120 of a semiconductor body 40 along a horizontally line close to the first surface 101 according to numerical simulations of the semiconductor device 100 to 400 as illustrated in FIGS. 1A to 2B. For simulations, a linearly with x decreasing p-doping of the first edge termination region 4 and a linearly with x increasing n-doping of the second edge termination region 5, more particular a linearly with x increasing difference between n-doping and p-doping, was used.

As expected from theoretical considerations, next to the pn-junction 16 between the first edge termination region 4 and the second edge termination region 5, $E_x(x)$ has the desired parabolic shape when no surface charges are present at or on the first surface 101 (curve a).

In case of surface charges, the parabolic shape is maintained but shifted (towards the edge 41 for negative surface charges, curve b). This results only in a minor reduction of the breakdown voltage even for comparatively large surface charges of $+/-10^{12}$ elementary charges/cm$^2$ (curve b was obtained for a surface charge of about $-5*10^{11}$ elementary charges/cm$^2$).

Figure 3B:
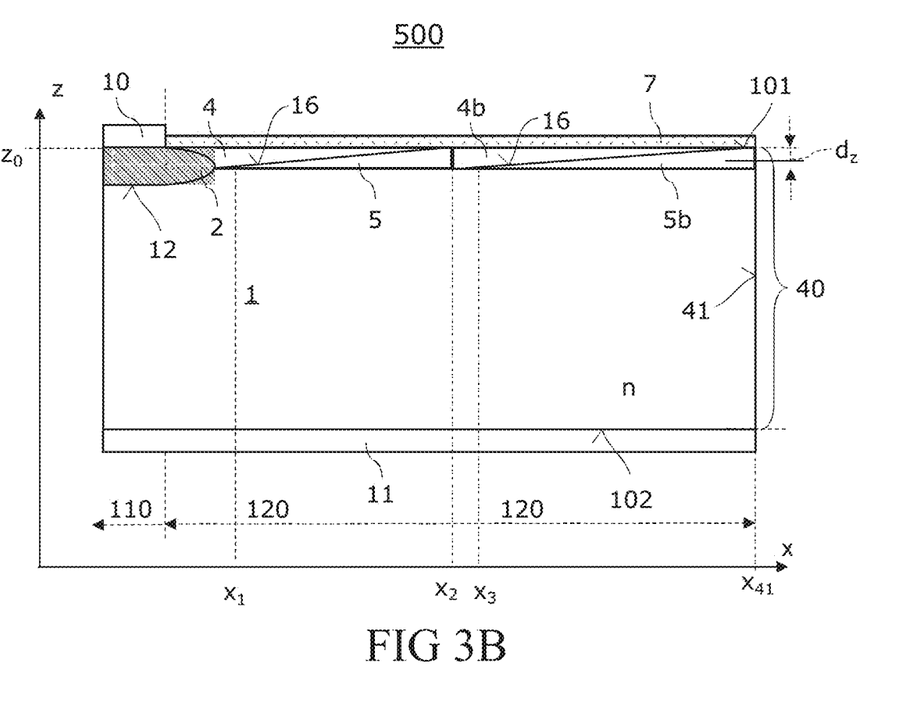
FIG. 3B illustrates a vertical cross-section through a semiconductor body of a bipolar semiconductor device according to an embodiment.

As illustrated in FIG. 3B showing a right section of a vertical cross-section through a bipolar semiconductor device 500 which is similar to the bipolar semiconductor device 100 explained above with regard to FIG. 1A, the second edge termination region 5 may be arranged between the first edge termination region 4 and the first semiconductor region 1.

Furthermore, the second edge termination region 5 may have a vertical extension which increases with decreasing distance from the edge 41. For example, the second edge termination region 5 may have a triangular shape in the vertical cross-section.

Even further, more than two edge termination region 4, 5 as explained above may be arranged in the peripheral area 120.

In the exemplary embodiment, a p-type third edge termination region 4b is arranged between the second edge termination region 5 and the edge 41, and an n-type fourth edge termination region 5b is arranged between the third edge termination region 4b and the edge 41.

Even if the respective volume specific dopings of the edge termination regions 4, 4a, 5, 5a do not vary, the vertically integrated difference between the concentration of n-dopants and the concentration of p-dopants increases (substantially) linearly in sections with decreasing distance $x_{41}-x$ from the edge 41 (between $x_1$ and $x_2$, and above $x_3$) as desired.

Figure 4A:
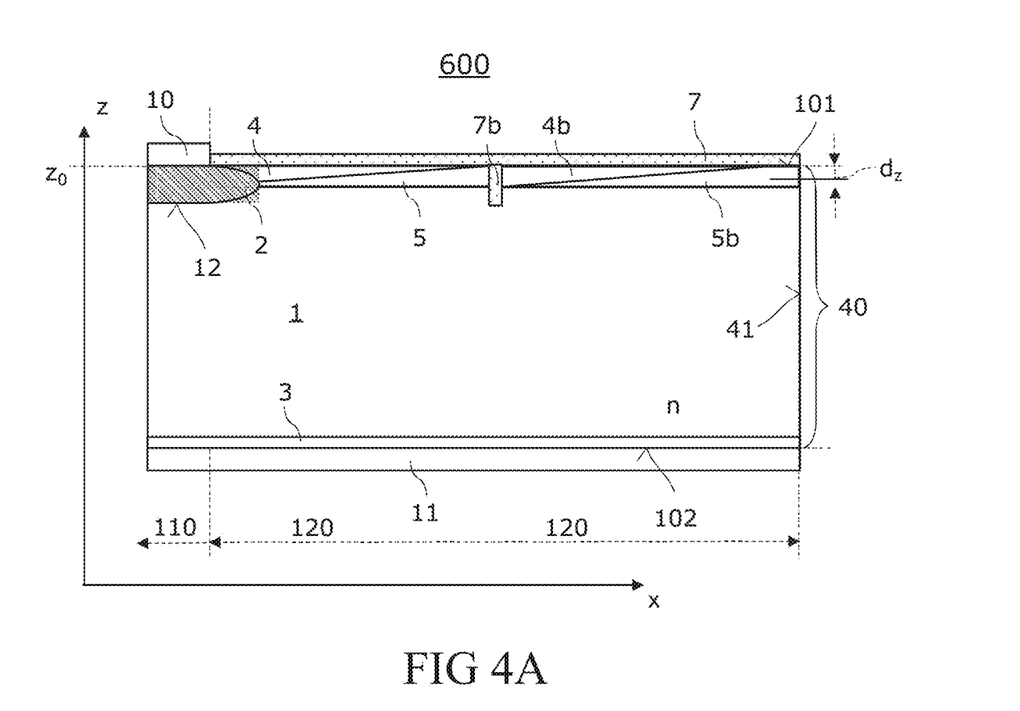
FIG. 4A illustrates a vertical cross-section through a semiconductor body of a bipolar semiconductor device according to an embodiment.

As illustrated in FIG. 4A showing a right section of a vertical cross-section through a bipolar semiconductor device 600 which is similar to the bipolar semiconductor device 600 explained above with regard to FIG. 3B but typically implemented as a bipolar transistor, a dielectric region 7b may be arranged between an inner pair of the edge termination regions 4, 5 and outer inner pair of the edge termination regions 4b, 5b.

When seen from above, the dielectric region 7b as well as the edge termination regions 4, 4a, 5, 5a may be substantially ring shaped.

The dielectric region 7b may extend deeper into the semiconductor body 40 than the edge termination regions 4, 4b, 5, 5b.

Adjacent edge termination regions 4, 4b, 5, 5b of the same conductivity type may, however, also be (electrically) connected.

Figure 4B:
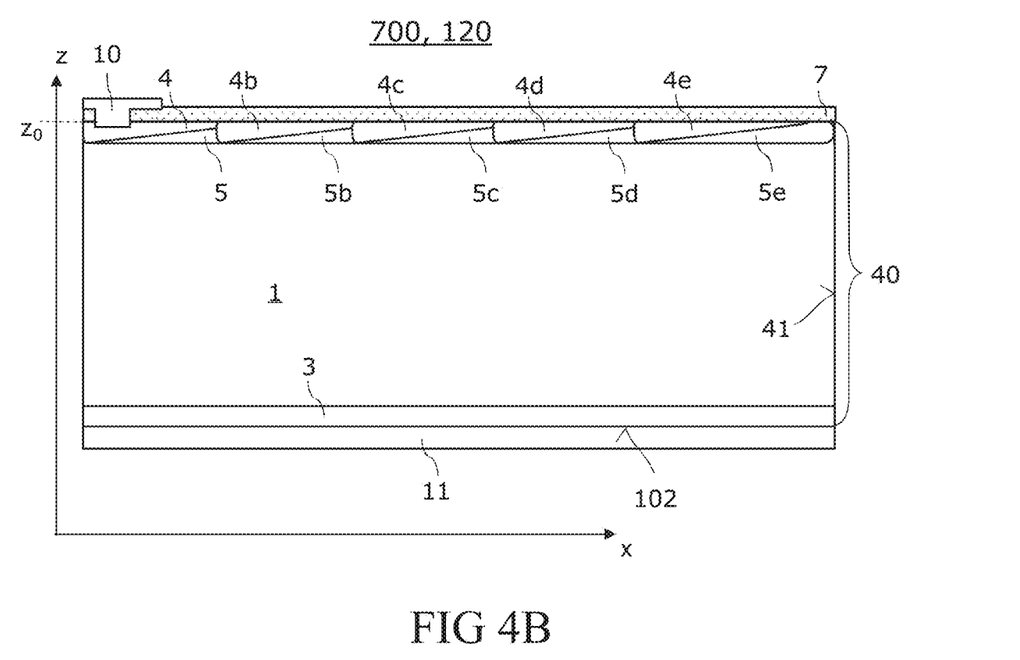
FIG. 4B illustrates a vertical cross-section through a semiconductor body of a bipolar semiconductor device according to an embodiment.

As illustrated in FIG. 4B showing a right section of a vertical cross-section through a bipolar semiconductor device 700 which is similar to the bipolar semiconductor devices 100 to 600 explained above with regard to FIG. 1A to 3B and e.g. implemented as an IGBT, a plurality pairs (4, 5), (4b, 5b), (4c, 5c), (4d, 5d), (4e, 5e) of the edge termination regions (VLD-regions 4-5e) may be arranged in the peripheral area 120. Further, the pairs (4, 5), (4b, 5b), (4c, Sc), (4d, 5d), (4e, 5e) of the edge termination regions may be pairwise separated from each other by respective dielectric regions 7b, 7bc, 7dc, 7de.

Alternatively or in addition to the dielectric regions 7b, 7bc, 7dc, 7de, one or more pairs (4, 5), (4b, 5b), (4c, 5c), (4d, 5d), (4e, 5e) of adjoining edge termination regions of opposite doping type may be combined with other edge termination structures such as floating field plates arranged on the first surface 101.

In the following methods for manufacturing the above explained bipolar semiconductor devices are explained.

In a first step a wafer 40 having an upper side 101 typically formed as a flat surface, a lower side 102 typically also formed as a flat surface and an n-type semiconductor layer 1' extending to the upper side 101 is provided.

Depending on the device to be manufactured, the wafer 40 may include a p-doped or n-doped substrate extending to the lower side 102 and one or more epitaxial layers formed on the substrate.

Thereafter, an active area 110 and a peripheral area 120 surrounding the active area 110 when seen from above may be defined.

After optional and typically device dependent processes of structuring the active area 110, donors and acceptors may be introduced from the upper side 101 into the semiconductor layer 1' in the peripheral area 120.

For example, a semiconductor region 2 arranged at the first side and forming a pn-junction 12 with the semiconductor layer 1' may be formed in the peripheral area 110 or at least partly formed, e.g. by masked implanting acceptor ions into the active area 110 with a subsequent annealing or drive-in step.

It is however also possible that at least a part of the processes for structuring the active area 110 are performed after the structuring of the peripheral area 120 so that a p-type first edge termination region 4 and an n-type second edge termination region 5 are formed at the upper side 101 in respective portions of the semiconductor layer 1' of the peripheral area 120, that the first edge termination region 4 has in a vertical direction z a first extension, and in a horizontal direction x a second extension, which is at least two times or at least 5 times larger than the first extension, that the first edge termination region 4 is arranged between the second edge termination region 5 and the active area 110, and that the second edge termination region 5 has a varying concentration of dopants, which increases at least next to the first edge termination region 4 with an increasing distance from the first edge termination region 4 and/or with an increasing distance from the active area 110, and has in the vertical direction z a third extension, and in the horizontal direction x a fourth extension which is at least two times larger than the third extension.

In one embodiment, donors and acceptors are introduced by masked implanting of donor ions and acceptor ions from the upper side 101 and subsequent annealing (drive-in).

Figure 6A:
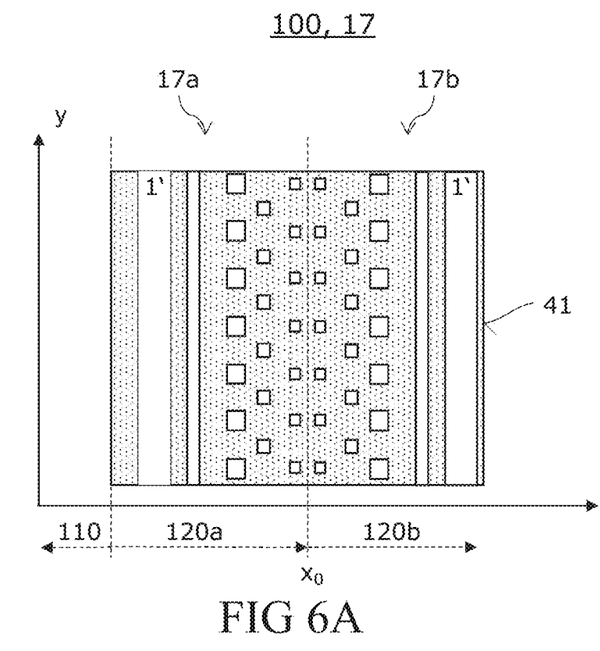

As illustrated in FIG. 6A in a top view, a mask 17 having first openings in in an outer portion 17b on the outer portion 120b of the peripheral area 120 and second openings in an inner portion 17a on the inner portion 120a of the peripheral area 120 arranged between the outer portion 120b and the active area 110 may be formed on the first side 101, so that the first openings expose an area of the semiconductor layer 1' (have an area when seen from above) in the outer portion 120b which increases with a distance from the active area 110, and that the second openings expose an area of the semiconductor layer 1' (have an area when seen from above) in the inner portion 120a which decreases with a distance from the active area 110.

In the exemplary embodiment, the first openings and second openings of the mask 17 are rectangular when seen from above (represented by empty rectangles in FIG. 6A). This is however only an example (stripes, circles or other geometries are also possible).

Note that FIG. 6A only represents a typically small part of the mask 17. The exemplary two innermost and the exemplary two outermost openings (elongated rectangles) may surround the active area 110 and/or may be substantially ring-shaped in a top view of the complete mask 17.

Figure 5A:
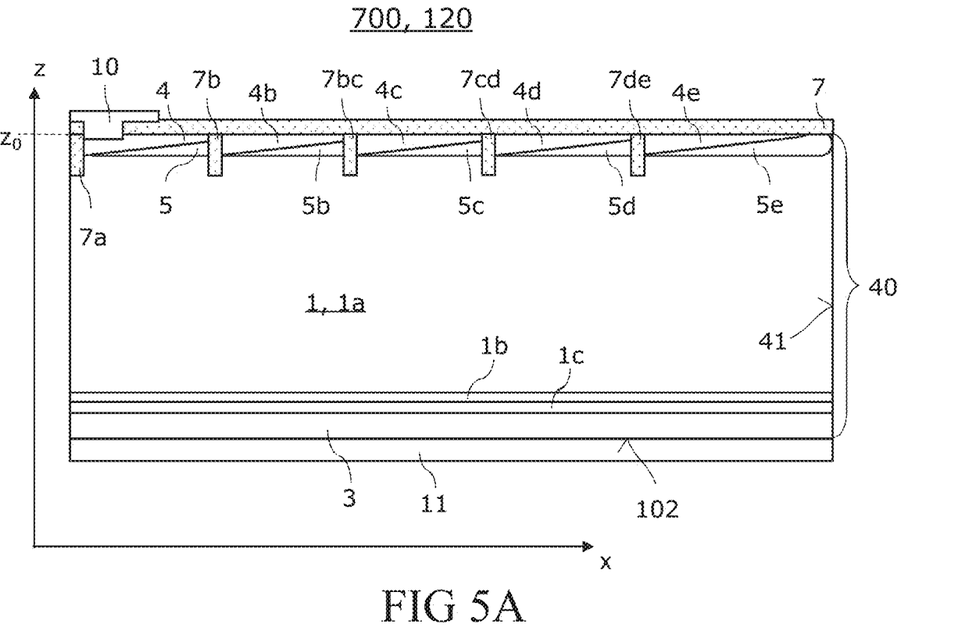
FIG. 5A illustrates a vertical cross-section through a semiconductor body of a bipolar semiconductor device according to an embodiment.
Figure 5B:
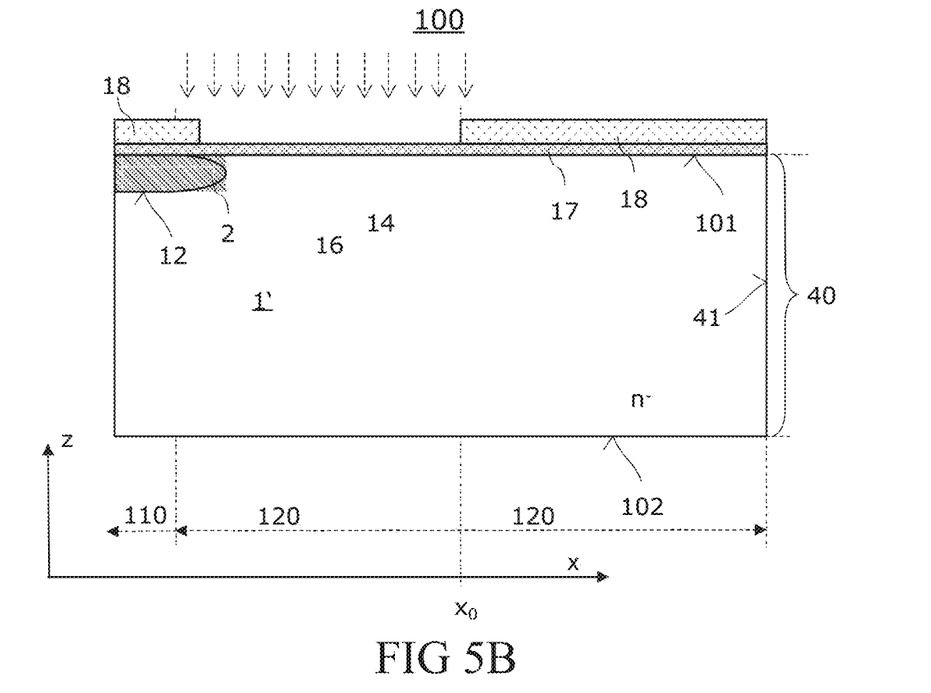
Figure 6B:
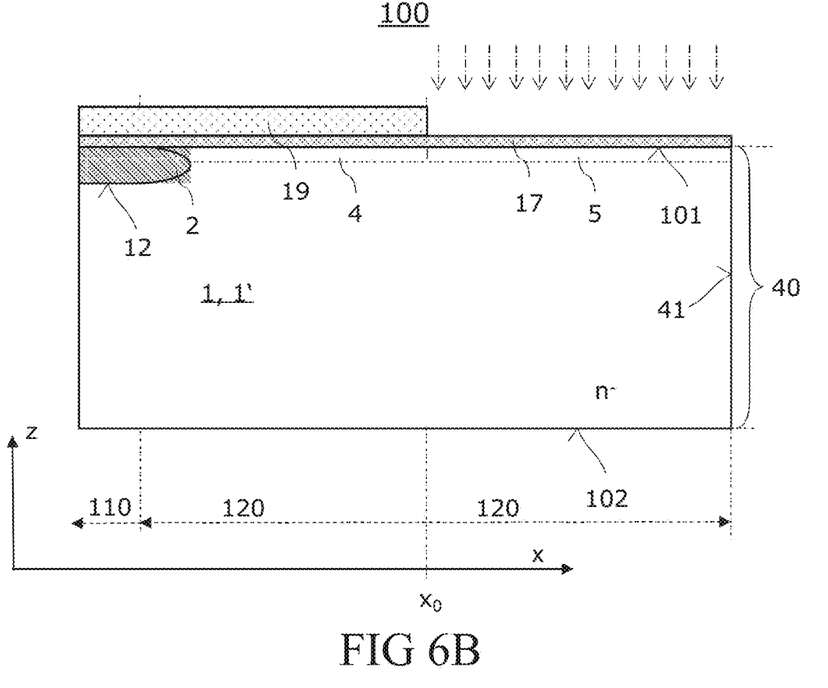

As illustrated in respective vertical cross-sections in FIGS. 5B and 6B, the inner portion 17a of the mask 17 may be covered with a photo resist mask 19 prior to implanting donor ions (dashed-dotted arrows) and the outer portion 17b of the mask 17 may be covered with a photo resist mask 18 prior to implanting acceptor ions (dashed arrows) into the peripheral area 120 (composed mask technique).

After removing the masks 18, 19, and thermal annealing, the first edge termination region 4 and the second edge termination region 5 are formed with the desired properties.

For manufacturing semiconductor devices having more than two edge termination region 4 as illustrated above in FIG. 3B to FIG. 5A, a similar mask but having a design with several alternating portions 17a, 17b may be used.

Further, several implantation processes with different energy may be used for forming edge termination region 4, 5 with varying penetration depth.

Typically, boron ions are used as acceptor ions and phosphorous ions are used as donor ions for implantations into a silicon layer 1'. However, it is also possible to use other dopants such as arsenic and antimony.

Selenium has been found to be less suitable as dopant. The lateral doping profile formed with selenium dopants is less reproducible. Further, the discharging time of selenium donors is too large for many applications. Even further, it has been found that the penetration depth of selenium is too large for the desired comparatively flat geometry of the (second) edge termination region.

The respective implantation angle between the normal direction of the first side 101 and the ion beam during implanting the donor ions and/or during implanting the acceptor ions may be less than about 0.15°.

In so doing, the so called channeling effect occurring at in the wafer 40 at resin free mask openings may be used.

Accordingly, mask variations as well as segregation effects at an interface between semiconductor material of the wafer 40 and an oxide are less important for the doping profile. Further, a vertically wider implantation profile and a vertically deeper end-of range of the implantation may be achieved. This may facilitate diffusion of dopants during annealing into desired doping profiles.

Typically, several bipolar semiconductor devices 100 are manufactured in parallel on wafer level. FIG. 5B typically corresponds to a right section of one of the several semiconductor devices 100 to be manufactured and finally separated at lateral edges 41, typically by sawing.

In a further embodiment, a substantially homogeneous n-doped layer is formed at the first side 101 in the peripheral area 120 after providing the wafer 40, e.g. by implanting without masking the peripheral area and subsequent annealing.

Thereafter, a mask having openings that expose an area of the semiconductor layer 1' in the peripheral area 120 (have an area when seen from above) which decreases with an increasing distance from the active area 110 (i.e. the mask layout is typically similar as show in FIG. 6A for the mask 17a but extends between the active area 110 and the edge 41) may be formed on the first side 101 and subsequently used for implanting acceptor ions into the semiconductor layer 1'.

In this embodiment, the dose for implanting acceptor ions is chosen such that the n-doping of the n-doped layer is partly compensated in the outer portion 120b (where the second edge termination region 5 is to be formed) and overcompensated in the inner portion 120a (where the first edge termination region 4 is to be formed).

Thereafter, a further annealing may be used.

In a further embodiment, a substantially homogeneous p-doped layer is formed at the first side 101 in the peripheral area 120 after providing the wafer 40, e.g. by implanting without masking the peripheral area 120 and subsequent annealing.

Thereafter, a mask having openings that expose an area of the semiconductor layer 1' in the peripheral area 120 (have an area when seen from above) and that increase with an increasing distance from the active area 110 (i.e. the mask layout is typically similar as show in FIG. 6A for the mask 17b but extends between the active area 110 and the edge 41) may be formed on the first side 101 and subsequently used for implanting donor ions into the semiconductor layer 1'.

In this embodiment, the dose for implanting donor ions is chosen such that the p-doping of the p-doped layer is partly compensated in the inner portion 120a (where the first edge termination region 4 is to be formed) and overcompensated in the outer portion 120b (where the second edge termination region 5 is to be formed).

Thereafter, a further annealing (thermal process) may be used.

In still a further embodiment, the dopants are outdiffused from a mask formed on the first side 101 in the peripheral area 120.

For example, a mask formed by a doped material such as an oxide doped with first dopants and having openings that exposes an area of the semiconductor layer 1' in the peripheral area 120 which increases with an increasing distance from the active area 110 (the mask layout may be similar as show in FIG. 6A for the mask 17a but extends between the active area 110 and the edge 41) may be formed on the first side 101.

Thereafter, a first thermal process may be used to outdiffuse the first dopants from the mask into the semiconductor layer.

Thereafter, an optional cap layer may be formed on the mask. Accordingly, any cross-contamination with the following implantation process may be avoided.

Thereafter, ions of dopants which are of an opposite doping type may be implanted into the semiconductor layer 1' using the mask.

Thereafter, a second thermal process may be used to activate the implanted ions in the semiconductor layer 1'.

After forming the first and second edge termination regions 4, 5, further processes such as forming dielectric layers and metallizations on the first side 101 may be performed from the first side.

Further, further processes such as forming a metallization on the second side 102 may be performed.

Thereafter, the wafer 40 may be diced into individual semiconductor devices.

According to an embodiment of a semiconductor device, the semiconductor device includes a semiconductor body including a first side, an edge delimiting the semiconductor body in a direction parallel to the first side, a first semiconductor region of a first conductivity type, a second semiconductor region of a second conductivity type forming a pn-junction with the first semiconductor region, a first edge termination region of the second conductivity type which adjoins the first semiconductor region, and is arranged between the second semiconductor region and the edge, and a second edge termination region of the first conductivity type forming a further pn-junction with the first edge termination region. The second edge termination region is arranged between the first edge termination region and the edge but not between the first edge termination region and the first side, and has a varying concentration of dopants of the first conductivity type which increases with increasing distance from the further pn-junction. The second edge termination region has, in a vertical direction perpendicular to the first side, a first extension and, in a horizontal direction parallel to the first side, a second extension which is at least two times, typically at least 5 times larger than the first extension.

According to an embodiment of a method for manufacturing a semiconductor device, the method includes providing a wafer having an upper side and including a semiconductor layer extending to the upper side. An active area and a peripheral area surrounding the active area when seen from above are defined. From the upper side donors and acceptors are introduced into the semiconductor layer so that a first edge termination region and a second edge termination region of opposite conductivity type are formed at the upper side in respective portions of the semiconductor layer which are arranged in the peripheral area. The method is performed so that the first edge termination region is arranged between the second edge termination region and the active area, and has in a vertical direction perpendicular to the upper side a first extension, and in a horizontal direction parallel to the upper side a second extension which is at least two times or even at least 5 times larger than the first extension. The method is performed so that the second edge termination region has in the vertical direction a third extension, and in the horizontal direction a fourth extension which is at least two times or even at least 5 times larger than the third extension, and that the second edge termination region includes a varying concentration of dopants which decreases, at least next to the first edge termination region, with a decreasing distance from the first edge termination region and/or with a decreasing distance from the active area.

According to an embodiment of a semiconductor device, the semiconductor device includes a semiconductor body including a first side, an edge delimiting the semiconductor body in a direction parallel to the first side, an active area, a peripheral area arranged between the active area and the edge, a first semiconductor region of a first conductivity type extending from the active area into the peripheral area, a second semiconductor region of a second conductivity type forming a pn-junction with the first semiconductor region, a first edge termination region of the second conductivity type adjoining the first semiconductor region, and arranged at the first side and between the second semiconductor region and the edge, and a second edge termination region of the first conductivity type arranged at the first side and between the first edge termination region and the edge. The second edge termination region has a varying concentration of dopants of the first conductivity type which increases smoothly, e.g. substantially linearly, with an increasing distance from the first edge termination region and/or with an increasing distance from the active area. An extension of the second edge termination in a horizontal direction parallel to the first side is larger than an extension of the second edge termination in a vertical direction parallel to the first side, typically by a factor of at least two or even five. Typically, an extension of the first edge termination in the vertical direction substantially matches the extension of the second edge termination in the vertical direction.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body comprising:
   a first side;
   an edge delimiting the semiconductor body in a direction parallel to the first side;
   an active area;
   a peripheral area arranged between the active area and the edge;
   a first semiconductor region of a first conductivity type extending from the active area into the peripheral area;
   a second semiconductor region of a second conductivity type forming a pn-junction with the first semiconductor region;
   a first edge termination region of the second conductivity type adjoining the first semiconductor region in the peripheral area, and arranged at the first side and between the second semiconductor region and the edge; and
   a second edge termination region of the first conductivity type comprising a varying concentration of dopants of the first conductivity type, which increases at least next to the first edge termination region substantially linearly with an increasing distance from the first edge termination region and/or with an increasing distance from the active area, and arranged at the first side and between the first edge termination region and the edge;
wherein the first and second edge termination regions are separated from one another by a portion of the first semiconductor region.

* * * * *